US006906645B2

(12) United States Patent
Jones et al.

(10) Patent No.: US 6,906,645 B2
(45) Date of Patent: Jun. 14, 2005

(54) DATA COMPRESSION HAVING MORE EFFECTIVE COMPRESSION

(75) Inventors: Simon Richard Jones, Loughborough (GB); Jose Luis Nunez Yanez, Loughborough (GB)

(73) Assignee: BTG International Limited, London (GB)

( * ) Notice: Subject to any disclaimer, the term of this patent is extended or adjusted under 35 U.S.C. 154(b) by 0 days.

(21) Appl. No.: 10/693,644

(22) Filed: Oct. 27, 2003

(65) Prior Publication Data

US 2004/0189494 A1 Sep. 30, 2004

Related U.S. Application Data

(63) Continuation of application No. 10/182,183, filed as application No. PCT/GB01/00230 on Jan. 22, 2001, now Pat. No. 6,667,699.

(30) Foreign Application Priority Data

Jan. 25, 2000 (GB) .............................................. 0001707

(51) Int. Cl.[7] .............................................. H03M 7/40
(52) U.S. Cl. ........................................ 341/51; 341/87
(58) Field of Search .............................. 341/51, 63, 87

(56) References Cited

U.S. PATENT DOCUMENTS

| 5,473,326 A | * | 12/1995 | Harrington et al. ............ 341/51 |
| 5,521,597 A | * | 5/1996 | Dimitri ........................ 341/51 |
| 5,701,125 A | | 12/1997 | Berlin |
| 5,889,818 A | | 3/1999 | Spiess |
| 6,121,901 A | * | 9/2000 | Welch et al. ................. 341/51 |
| 6,169,499 B1 | * | 1/2001 | Cooper ........................ 341/51 |

FOREIGN PATENT DOCUMENTS

| GB | 2 277 179 A | 10/1994 |
| WO | WO 95/18996 A3 | 7/1995 |
| WO | WO 95/18996 A2 | 7/1995 |
| WO | WO 98/04045 | 1/1998 |
| WO | WO 99/44292 | 9/1999 |

OTHER PUBLICATIONS

Kjelso et al., Design and performance of a Main Mmory Hardware Data Compressor, IEEE 1996, Proceedings of the 22nd EUROMICRO Conference, Beyond 2000 Hardware and Software Design Strategies, pp. 423–430.*

Kjelso et al., Empirical Study of Memory–data: Characteristics and Compressibility, IEE Proceedings—Computers and Digital Techniques, IEE Jan 1998, vol. 145 No. 1, pp. 63–67.*

Nunez, J.L., et al; "The X–MatchLITE FPGA–Based Data Compressor"; *Proceedings of EUROMICRO–25*; Sep. 9, 1999 to Sep. 10, 1999, Milan, Italy, IEEE. (7 pgs).

* cited by examiner

*Primary Examiner*—Howard L. Williams
(74) *Attorney, Agent, or Firm*—Nixon & Vanderhye (57) ABSTRACT

Lossless data compression system comprising a content addressable memory dictionary, a coder, and a run length encoder connected to receive the output of the coder. The encoder is arranged to count the number of times a match consecutively occurs at a predetermined dictionary location, i.e. the number of times the same search tuple is loaded into the same address of the dictionary. Compression is improved.

12 Claims, 11 Drawing Sheets

Fig.3 (Cont iii).

Fig.4 (Cont iii).

DATA COMPRESSION HAVING MORE EFFECTIVE COMPRESSION

This application is a continuation of application Ser. No. 10/182,183, filed Oct. 7, 2002, now U.S. Pat. 6,667,699, which claims priority of PCT/GB01/00230 filed Jan. 22, 2001, the entire content of which is hereby incorporated by reference in this application.

This invention relates to a method and apparatus for the lossless compression of data.

BACKGROUND OF THE INVENTION

While lossy data compression hardware has been available for image and signal processing for some years, lossless data compression has only recently become of interest, as a result of increased commercial pressure on bandwidth and cost per bit in data storage and data transmission; also, reduction in power consumption by reducing data volume is now of importance.

The principle of searching a dictionary and encoding data by reference to a dictionary address is well known, and the apparatus to apply the principle consists of a dictionary and a coder/decoder.

In Proceedings of EUROMICRO-22, 1996, IEEE, "Design and Performance of a Main Memory Hardware Data Compressor", Kjelso, Gooch and Jones describe a novel compression method, termed the X-Match algorithm, which is efficient at compressing small blocks of data and suitable for high speed hardware implementation.

The X-Match algorithm maintains a dictionary of data previously seen, and attempts to match a current data element, referred to as a tuple, with an entry in the dictionary, replacing a matched tuple with a shorter code referencing the match location. The algorithm operates on partial matching, such as 2 bytes in a 4 byte data element. In Proceedings of EUROMICRO-25, 1999, IEEE, "The X-MatchLITE FPGA-Based Data Compressor", Nunez, Feregrino, Bateman and Jones describe the X-Match algorithm implemented in a Field Programmable Gate Array (FPGA) prototype.

SUMMARY OF THE INVENTION

It is an object of the invention to provide a lossless data compression algorithm which can compress data more effectively than is possible with the published arrangement.

According to the invention, a lossless data compression system comprising a content addressable memory dictionary and a coder, characterised by run length encoding means connected to receive the output of the coder, said encoding means being arranged to count the number of times a match consecutively occurs at a predetermined dictionary location.

Also according to the invention, a lossless method of compressing data comprising the steps of:

comparing a search tuple of fixed length with a plurality of tuples of said fixed length stored in a dictionary;

indicating the location in the dictionary of a full or partial match or matches;

selecting a best match of any plurality of matches; and encoding the match location and the match type;

characterised by the further steps of:

loading each search tuple in turn into the same address in the dictionary;

and counting the number of times identical tuples are matched consecutively into said address.

Preferably said same address as the first location in the dictionary.

BRIEF DESCRIPTION OF THE DRAWINGS

In the drawings.

The invention will be described by way of example only with reference to FIGS. 2–5 in which.

DETAILED DESCRIPTION OF PREFERRED EMBODIMENTS

Figure 1:
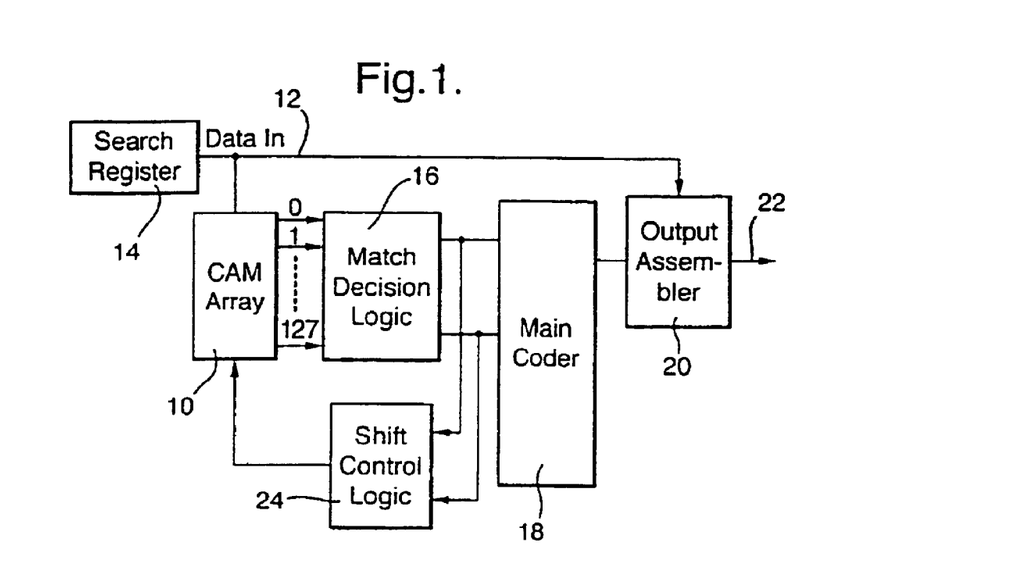
FIG. 1 illustrates the architecture of a compressor arrangement published by Nunez et al.

In the prior art as shown in FIG. 1, a dictionary 10 is based on Content Addressable Memory (CAM) and is searched by data 12 supplied by a search register 14. In the dictionary 10 each data element is exactly 4 bytes in width and is referred to as a tuple. With data elements of standard width, there is a guaranteed input data rate during compression and output data rate during decompression, regardless of data mix.

The dictionary stores previously seen data for a current compression; when the search register 14 supplies a new entry and a match is found in the dictionary, the data is replaced by a shorter code referencing the match location. CAM is a form of associative memory which takes in a data element and gives a match address of the element as its output. The use of CAM technology allows rapid searching of the dictionary 10, because the search is implemented simultaneously at every address at which data is stored, and therefore simultaneously for every stored word.

In the X-Match algorithm, perfect matching is not essential. A partial match, which may be a match of 2 or 3 of the 4 bytes, is also replaced by the code referencing the match location and a match type code, with the unmatched byte or bytes being transmitted literally, everything prefixed by a single bit. This use of partial matching improves the compression ratio when compared with the requirement of 4 byte matching, but still maintains high throughput of the dictionary.

The match type indicates which bytes of the incoming tuple were found in the dictionary and which bytes have to be concatenated in literal form to the compressed code. There are 11 different match types that correspond to the different combinations of 2,3 or 4 bytes being matched. For example 0000 indicates that all the bytes were matched (full match) while 1000 indicates a partial match where bytes 0, 1 and 2 were matched but byte 3 was not, and must be added as an uncompressed literal to the code. Since some match types are more frequent than others a static Huffman code based on the statistics obtained through extensive simulation is used to code them. For example the most popular match type is 0000 (full match) and the corresponding Huffman code is 01. On the other hand a partial match type 0010 (bytes 3, 2 and 0 match) is more infrequent so the corresponding Huffman code is 10110. This technique improves compression.

If, for example, the search tuple is CAT, and the dictionary contains the word SAT at position 2, the partial match will be indicated in the format (match/miss) (location) (match type) (literals required) which in this example would be 022S, binary code 0 000010 0010 1010011, i.e. the capital C is not matched, and is sent literally to the coding part of the system The algorithm, in pseudo code, is given as:

```
Set the dictionary to its initial state;
DO
    { read in tuple T from the data stream;
    search the dictionary for tuple T;
    IF (full or partial hit)
        { determine the best match location
        ML and the match type MT;
        output '0';
        output Binary code for ML;
        output Huffman code for MT;
        output any required literal
        characters of T; }
    ELSE
        { output '1';
            output tuple T; }
    IF (full hit)
        {move dictionary entries 0 to ML-1 by
        one location;}
    ELSE
        { move all dictionary entries down by
        one location;}
    copy tuple T to dictionary location 0; }
WHILE (more data is to be compressed);.
```

The dictionary 10 is arranged on a Move-To-Front strategy, i.e. a current tuple is placed at the front of the dictionary and other tuples moved down by one location to make space. If the dictionary becomes full, a Least Recently Used (LRU) policy applies, i.e., the tuple occupying the last location is simply discarded.

The dictionary is preloaded with common data.

The coding function for a match is required to code three separate fields, i.e.

(a) the match location in the dictionary 10; uniform binary code where the codes are of the fixed length $\log_2$ (DICTIONARY_SIZE) is used.

(b) a match type; i.e. which bytes of an incoming tuple match in a dictionary location; a static Huffman code is used.

(c) any extra characters which did not match the dictionary entry, transmitted in literal form.

Referring again to FIG. 1, the match, or partial match or several partial matches, are output by the dictionary 10 to a match decision logic circuit 16, which supplies a main coder 18 which provides a coded signal to an output assembler 20 which provides a compressed data output signal 22. A shift control logic 24 connected between the match decision logic 16 and the dictionary 10 provides shift signals to the dictionary. The whole circuit can be provided on a single semiconductor chip.

Figure 2:
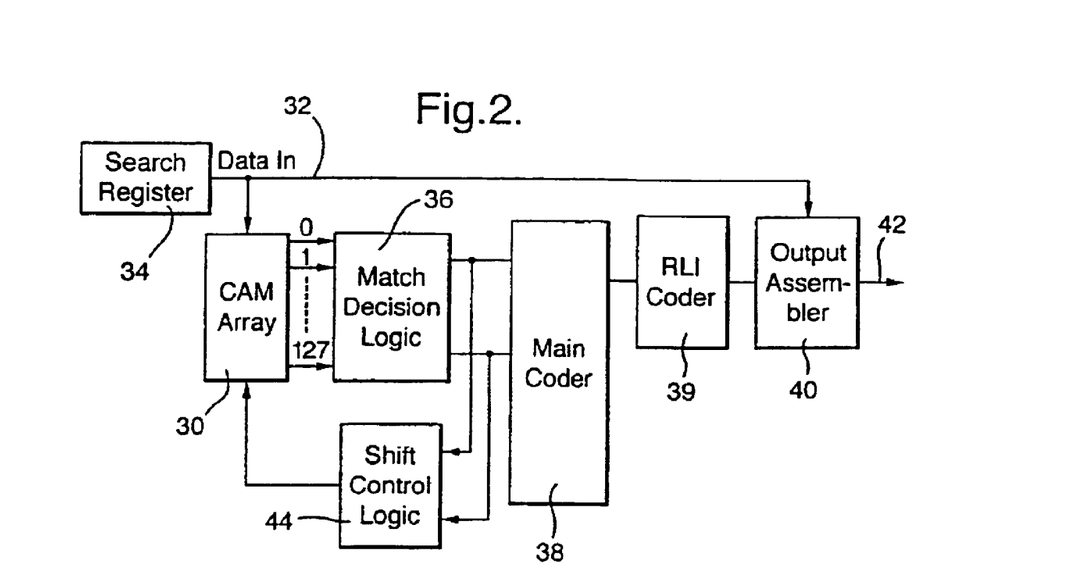
FIG. 2 illustrates the architecture of the compressor hardware

Referring now to a compressor according to the invention as illustrated in FIG. 2, a dictionary 30 is based on CAM technology and is supplied with data to be searched 32 by a search register 34. The dictionary searches in accordance with the X-Match algorithm, and is organised on a Move To Front strategy and Least Recently Used Replacement policy.

The dictionary output is connected to a match decision logic circuit 36 which is connected to a main coder 38, which provides signals to a coder 39 which will be referred to as a 'Run Length Internal' (RLI) coder, which provides signals to an output assembler 40. The assembler 40 provides an output stream of compressed data 42.

It is to be understood that, while it is known to apply run length encoding to data before it is coded, it has not previously been suggested that a run length encoder is positioned between the main coder and the output assembler in a data compression system.

Figure 3:
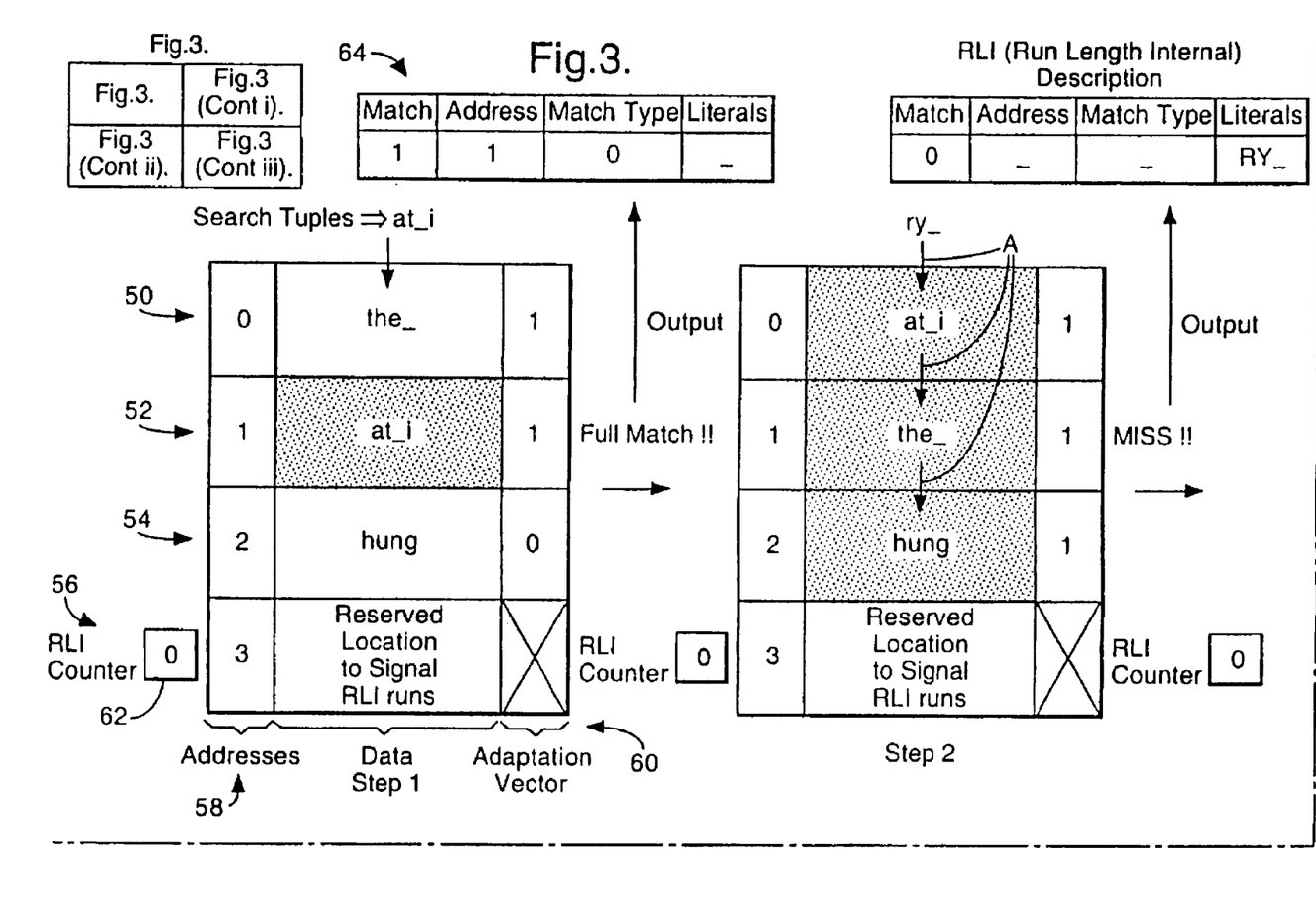
FIG. 3 illustrates the run length internal encoder

FIG. 3 illustrates the coder output and dictionary adaptation processed during normal and RLI coding events. Eight steps are shown; for each step the top four dictionary addresses 0, 1, 2, 3, references 50, 52, 54, 56, are shown, with the addresses 58 shown on the left and an adaptation vector 60 shown on the right. It will be seen that each location content is exactly 4 bytes long.

Dictionary address 3, reference 56, is a reserved location and is used to signal RLI runs; an internal run counter 62 is shown adjacent to address 3.

In each of the eight steps, a previous search tuple is loaded into address 0, reference 50, and the previously stored data is shifted down one position. This is indicated by the current adaptation vector on the right hand side of location 0 being set to 1 in all eight steps. If there is not a full match, the data in the last location is deleted to make room for a new tuple.

The arrows pointing downwards within the dictionary, such as the arrows A, indicate rearrangement of the dictionary at the end of each step under the control of the adaptation vector 60 of that step.

Associated with each step there is an output box 64 which indicates the output of the dictionary 30 for that step.

In step 1, the search tuple is "at_i"; a full match is found at address 1, reference 52, and the output in box 64 indicates this. The first entry in the box "1" indicates that a match has been found; the next entry indicates a match address; the third entry indicates the match type, i.e. "0" because the match is a full match. The fourth entry is blank, because, with a full match, there are no literals to be transmitted.

The dictionary is updated in accordance with the adaptation vector 60; a bit setting of "1" indicates "load data from previous position" and a bit setting of "0" indicates "keep current data"; therefore the entry at address 0, reference 50, is replaced by the search tuple "at_i" and the entry at address 1, reference 52, is replaced by "the"; the entry at address 2, reference 54, is unchanged.

In step 2, the search tuple is "ry_"; there is no match, i.e. a miss, and the output box 64 indicates that there is no match, i.e the first entry is "0"; the address and match type entries are blank, and the literals to be sent are "ry_".

The adaptation vector 60 updates the dictionary as indicated by the arrows A that is all entries move down one address.

In step 3 the search tuple is "this" and a partial match is found at address 2; the output box 64 indicates that there is a match, that the match is at address 2, that the match type is a partial match (i.e. the setting is "3"), and that the non-matching part—the literals to be sent, are "is". The dictionary is updated.

In step 4, the search tuple is "at_i", and a full match is found at address 2 as indicated in the output box 64.

In step 5, the search tuple is again "at_i", and a match is found at address 0, this is indicated in the output box 64.

Because the same tuple has been repeated, the internal run counter 62, which has remained at a zero setting in the previous steps, is now set to 1; a possible run is indicated, but a normal output is still given, box 64, because a run is not yet certain.

In step 6, the search tuple is again "at_i"; the internal run counter 62 is incremented to 2. This time a valid run is indicated, there is no output so the output box 64 is blank. Also the output corresponding to step 5 is empty from the RLI coding register since it will now be coded as part of the RLI event.

In step 7 the search tuple is once more "at_i", the internal run counter is incremented to 3, and the output box 64 remains blank.

In step 8 the search tuple is "at_v"; the internal run has ended. A partial match is found at address 0; the output box 64 indicates that the match is found at address 0, that the match type is partial, and that the literal to be sent is (v).

The count of the internal run counter 62 is now sent as shown in the RLI output box 66. A match was found at address 3, reference 56, i.e. the address reserved for internal runs, and the length of the run was 3, which is sent as an 8-bit code.

Although the arrangement is such that one dictionary address is lost (because it is reserved to signal RLI codes) the improvement in compression, which may be 10%, more than compensates for the one-word loss in dictionary size.

It is to be understood that internal run length encoding only operates with full matches, and not with partial matches. It will also be understand that full matches of 4 bytes of data can be detected. This is in contrast to the arrangement disclosed in the publication by Kjelso referred to above in which a run length encoder sensitive only to 0s is disclosed; runs of 0 are common in coding arrangements. In addition, the position of the prior art encoder was such that it preceded application of the X-Match encoder, i.e. it operated on incoming data before the data was supplied to the dictionary in which the X-Match algorithm is applied. In the inventive arrangement, the run length encoding is integrated with the dictionary coding and does not precede it.

The inventive arrangement has two distinct features; the first is that its contents can be search in a single cycle, and extra logic is added to a conventional content addressable memory to allow it to detect consecutive input sequences which are identical; this is achieved by transmission of a dictionary address which has not yet been utilised for the storage of dictionary data; this is described above. A second feature is that the dictionary size and the codes which indicate multiple consecutive input sequences are varied dynamically, based on the number of new data items to be entered into the dictionary; in other words, the size of the dictionary varies.

Figure 4:
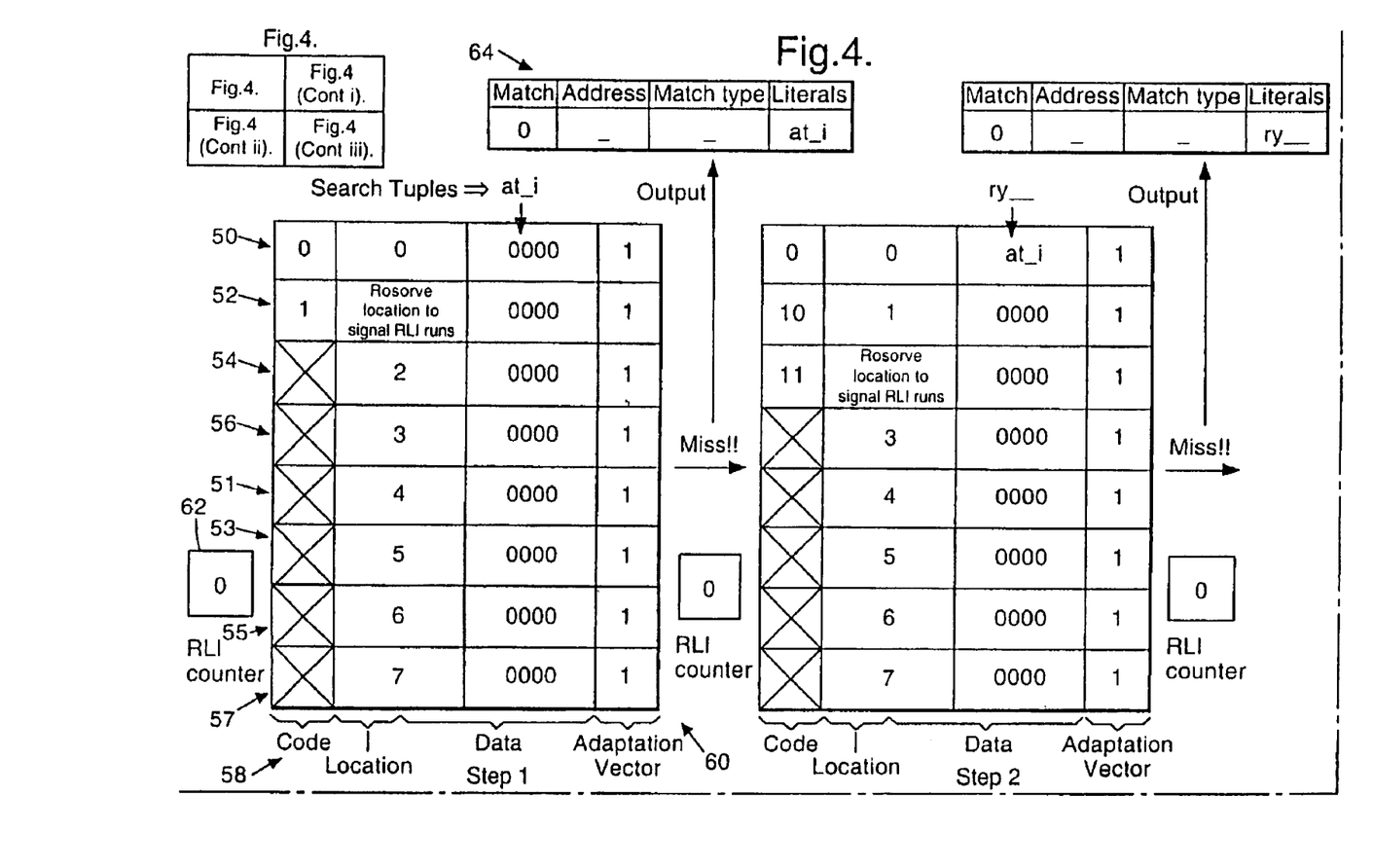
FIG. 4 illustrates a dictionary of varying size

This is illustrated in FIG. 4 which shows the same dictionary features as FIG. 3, but also shows 8 dictionary locations 50–56 and 51–57. In step 1 all the dictionary locations are set to the same data value, which in effect declares invalid all the dictionary locations below the first location 50, without the need for additional "dictionary location valid" logic. The reason is that in the case of multiple full matches during a dictionary search, the best match decision logic always selects the match closer to the top of the dictionary, thus invalidating all locations below it. The locations are all set to zero in the example.

In the first step, the code word book only has 2 values, corresponding to the first location 50, and to the RLI location, which at this stage is at location 52.

If, for example, the input data to the dictionary consists of 1020 bytes of data all of value zero, the dictionary does not grow in length, and the RLI code will be activated once to code a run of 255 tuples for the total of 1020 bytes. The run is counted by RLI counter 62 as described with reference to FIG. 3.

The output of the coder will be: 0 1 1 1 1 1 1 1 1 1 (10 bits).

0→Match 1→dictionary location (only two valid locations) 1 1 1 1 1 1 1 1 →255 run length.

In Step 1 the search tuple is at_i, which is output as a literal.

In Step 2 "at_i" has been stored in dictionary location 50, and the search tuple is "ry_"; the dictionary now has three valid locations, the location reserved to signal RLI runs having been moved from location 52 to location 54.

In Step 3, the search tuple is "this" and there are four valid locations. In Step 4, the search tuple is "at_i" and there are five valid locations, the reserved location now being at location 51.

Steps, 5, 6, 7 & 8 indicate the effect of a repeated tuple, the dictionary remains at a length of 5 valid locations, with the reserved location at 51.

If, after step 8, a new search tuple is presented, the dictionary will grow in size to store it.

The maximum compression ration enabled by the combination of RLI & PBC (Phased Binary Coding) is 10/(1020*8)=0.00122(819:1). Of course this is a maximum theoretical limit that will only be achieved when the data byte repeats itself for the entire length of the block but illustrates the advantage of combining an internal run length coder plus a move to front growing dictionary model. In general RLI will use to its advantage PBC as long as the dictionary is not completely full and a run of length greater than 2 takes place. If all the dictionary locations are valid using PBC or UBC (Uniform Binary Coding) gives the same results. Another prefix-free coding technique can be used to replace PBC and the same principles apply such as Rice coding or Phased Huffman Coding where a fraction of the dictionary is valid initially.

The algorithm, in pseudo code, is given as:

```
Set the dictionary to its initial state;
Set the next free location counter = 2;
Run length count = 0;
DO
{
  read in tuple T from the data stream;
  search the dictionary for tuple T;
  IF (full hit at location zero)
  {
    increment run length count by one;
  }
  ELSE
  {
    IF (run length count=1)
    {
      output "0";
      output phased binary code for ML 0;
      output Huffman code for MT 0;
    }
    IF (run length count >1)
    {
      output "0";
      output phased binary code for ML NEXT_FREE_LOCATION-1;
      output Binary code for run length;
    }
    set run length count to 0;
    IF(full or partial hit)
    {
      determine the best match location ML and the match type MT;
      output "0"
      output phased binary code for ML;
      output Huffman code for MT;
      output any required literal characters of T;
    }
    ELSE
    {
      output "1";
```

-continued

```
    output tuple T;
  }
}
IF (full hit)
  move dictionary entries 0 to ML-1 by one location
ELSE
{
  move all dictionary entries down by one location;
  increase next free location counter by one;
}
copy tuple T to dictionary location 0;
}
WHILE (more data is to be compressed);
```

Figure 5:
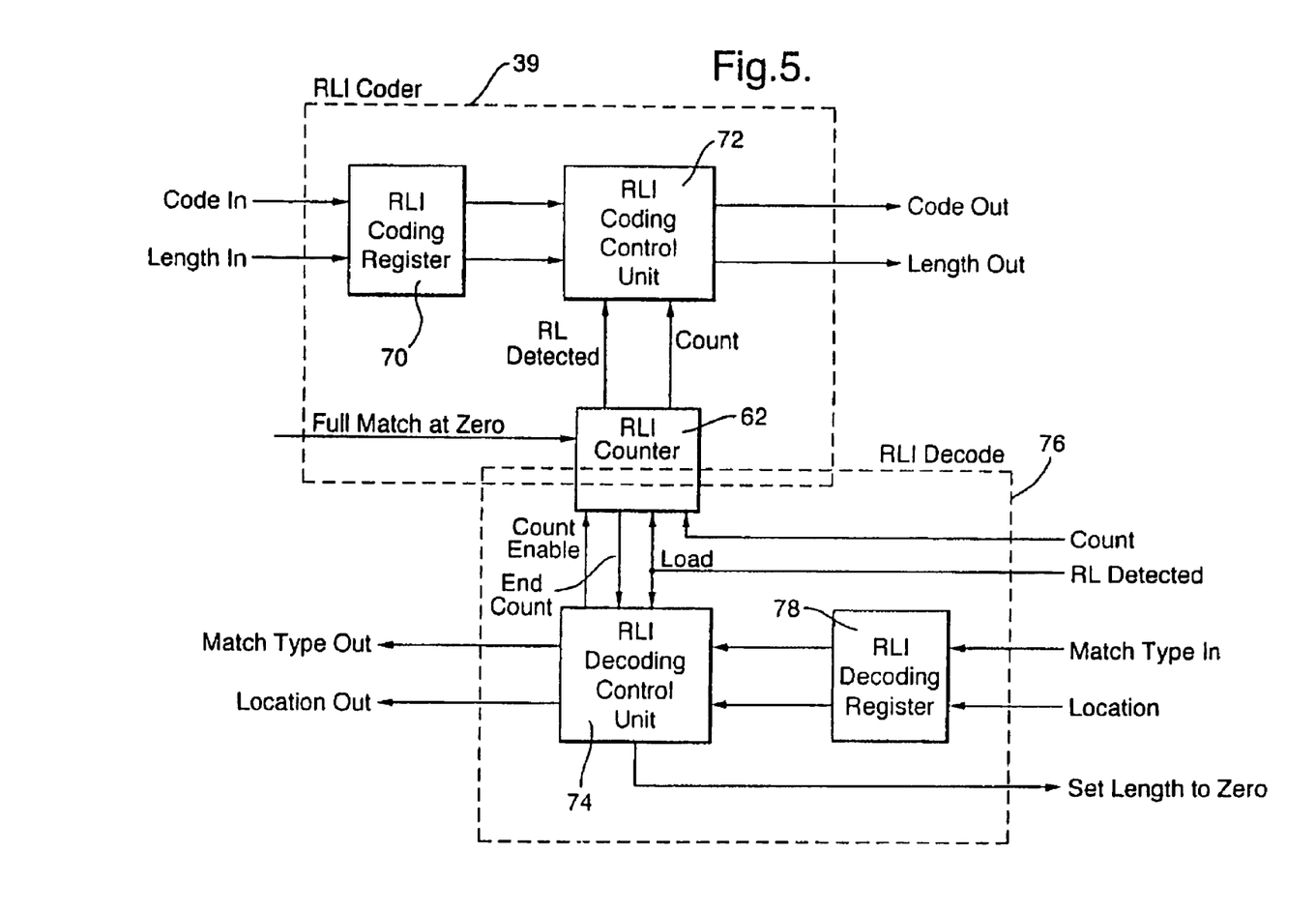
FIG. 5 illustrates in (detail the run length internal coder/decoder.

FIG. 5 illustrates the operation of a RLI coder and a RLI decoder.

During compression, as described with reference to FIG. 3, the counter 62 is activated by a full match at location 0; the counter remains enabled and counting while consecutive full matches at 0 are being detected. When the run terminates, the count is concatenated to the rest of the RLI code formed by a 0 indicating a match and the reserved position corresponding to the last active position in the dictionary.

During decompression the counter 62 is loaded with the count from the RLI code and then begins to count, starting at zero, until the loaded value is reached. The output of the RLI decoder is full match at location 0 while the count value is not reached.

The RLI coder 39 comprises a RLI coding register 70 and RLI coding control unit 72, which is connected to RLI counter 62 (see FIG. 3). Counter 62 is an 8-bit register and is common to both compression and decompression. The 8-bit counter 62 is connected to a RLI decoding control unit 74 in an RLI decoder 76 which also contains a RLI decoding register 78.

The RLI coding register 70 buffers code before the code accesses the RLI coding control unity 72; unit 72 controls the RLI coding process and outputs the correct code/code length pair depending on whether the compression is operating normally, or whether a run length coding event is taking place.

When the RLI coder 39 becomes active, the RLI coding register is empty from the previous code, and output is frozen while the run takes place.

In the RLI decoder 76, the RLI decoding control unit 74 has a complementary function to the RLI coding control unit 72; unit 74 outputs the correct match location/match type pair depending on whether the circuit is operating normally, i.e. on individual bytes, or if run length decoding is taking place.

The RLI decoding register 78 has the same functionality as the RLI coding register 70.

The 8 bit RLI counter 62 does not use any specific technique to detect an overflow condition if a pattern repeats more than 255 times. The counter simply loops back to 0, the condition is detected by the RLI control logic 72 as the end of a run, and a run length code is output. The next code after an RLI code event is always a normal code, even when the pattern continues to repeat. With a continued repeat, the counter 62 exceeds the count of 1 again and the run length detection signal is reactivated.

During decompression, the fact that no two RLI codes can be consecutive is used to load the RLI count into the RLI decoder 76 only once. This mode of operation simplifies the RLI control units.

Figure 6:
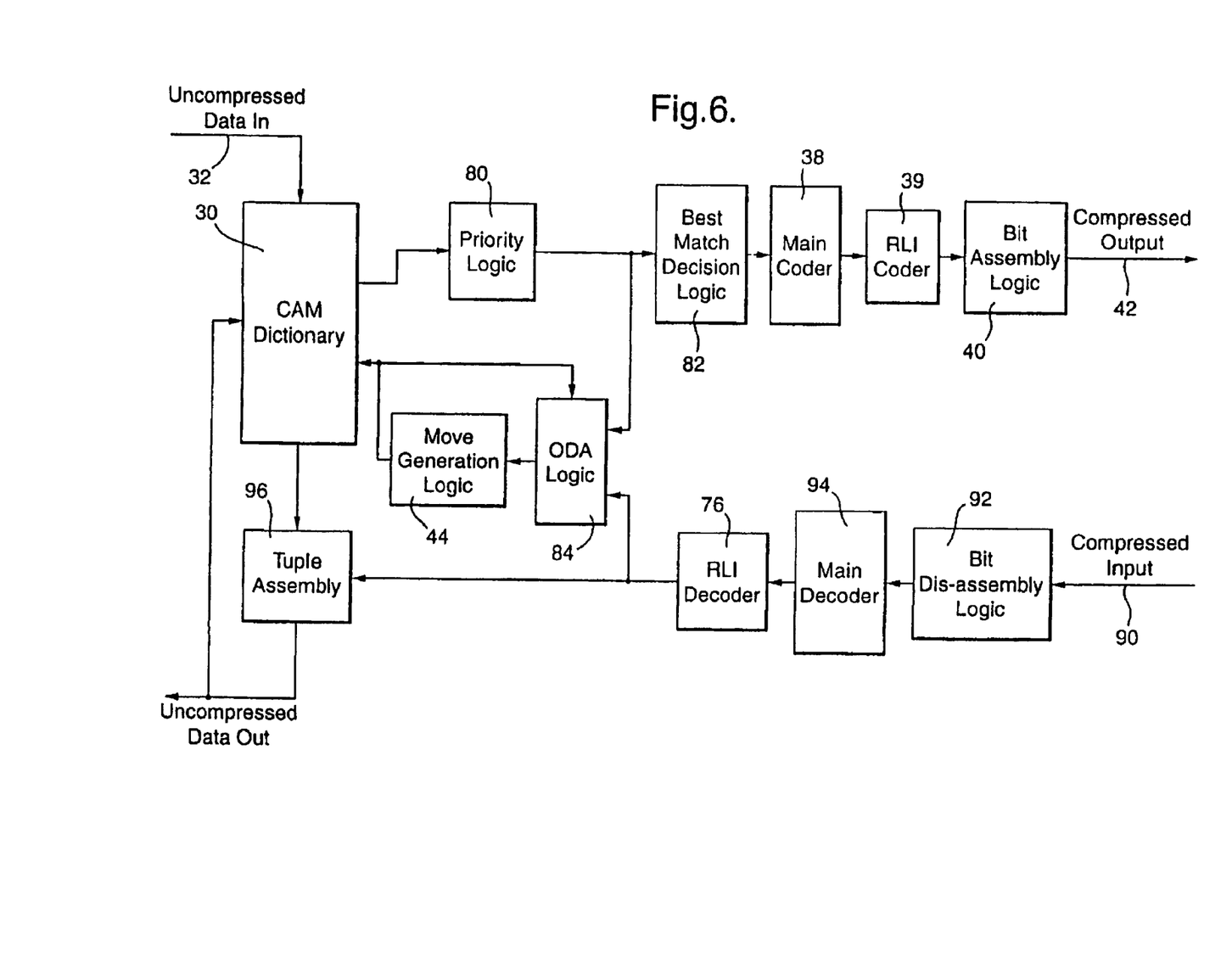
FIG. 6 illustrates the compressor/decompressor circuit schematically

A detailed coder/decoder circuit is shown in FIG. 6.

Uncompressed data 32 is supplied to the CAM dictionary 30, and the dictionary output, i.e. an indication of the dictionary address at which a match has been found, or the address of a partial match plus the unmatched byte or bytes, is supplied to a priority logic circuit 80, which assigns a different priority to each of the different types of possible matches in the dictionary, i.e. full, partial or miss, and supplies the result to a match decision logic circuit 82. Circuit 82 uses the priority types to select one of the matches as the best for compression using the priority information and supplies a signal to a main coder 38.

The main coder 38 operates, as described in the prior art referred to above, to assign a uniform binary code to the matching location and static Huffman code to the match type, and concatenates any necessary bytes in literal form. The compressed output is supplied to the RLI coder 39, described with reference to FIG. 4. This signal is produced by the main coder but is not shown in its diagram for simplicity. The RLI coder output passes to a bit assembly logic 40 which writes a new 64-bit compressed output to memory whenever more than 64 bits of compressed data are valid in an internal buffer (not shown). The output is compressed code 42.

The output from the priority logic circuit 80 is also supplied to an out-of-date adaptation (ODA) logic circuit 84, as described in our co-pending patent application Ser. No. GB 0001711.1 filed on even date. The output of the ODA circuit 84 is connected to a move generation logic circuit 44 which generates a move vector (as the adaptation vector applied in FIG. 3) depending on the match type and match location. The move generation logic 44 also provides a feedback signal to the ODA logic circuit 84. (NB out-of-date adaptation is not shown in FIG. 3 for simplicity)

For decompression, compressed input 90 is supplied to a bit disassembly logic circuit 92 which reads a new 64-bit compressed vector from memory whenever fewer than 33 bits are left valid in an internal buffer (not shown) after a decompression operation. The compressed vector is supplied to a main decoder 94 which decodes the match location and match type, together with any required literal characters and detects any possible RLI codes. The decoder 94 is connected to the RLI decoder 76 which supplies its run length decoded output to the ODA logic circuit 84 and also to a tuple assembly circuit 96.

The CAM dictionary 30 operates on the decoded input to regenerate 4 byte wide words which are supplied to the tuple assembly circuit 96; this circuit supplies uncompressed data 98, which comprises tuples assembled using information from the dictionary 30, plus any literal characters present in the code.

Application of Run Length Internal coding according to the invention has been found to achieve the compression improvement, which may be 10%, with little or no effect on the speed of compression. The improvement results from the efficient run length encoding of any repeating pattern, such as a 32 bit pattern. The most common repeating pattern is a run of 0s, but others are possible such as the space character in a text file or a constant background colour in a picture. Application of the invention allows efficient, lossless coding and decoding of such non-zero characters.

The Least Recently Used dictionary maintenance policy forces any repeating pattern to be located at position zero in the dictionary 30. Run Length Internal coding detects and codes any vector which is fully matched at position zero twice or more.

Such an arrangement offers a compression advantage in comparison with locating a run length encoder before the dictionary in a compression system, and since it uses the dictionary logic, complexity is kept to a minimum with a higher level of integration in the architecture.

The CAM dictionary 30 can have 15, 31 or 63 words; one position is already reserved for RLI events. A bigger dictionary improves compression but increases complexity significantly.

The uncompressed data-out 98 is identical to the data-in 32. There has been no loss.

The present invention is likely to find application when small blocks of data are to be compressed.

What is claimed is:

1. A lossless data compression system comprising:

an input for data to be compressed, a dictionary comprising a content addressable memory and a coder for encoding the location of matching data in the dictionary and the type of a full or partial match, a run length encoder connected to receive the output of the coder, the run length encoder being arranged to count the number of times a match consecutively occurs at the same predetermined dictionary location.

2. A system according to claim 1 in which the dictionary is arranged so that at each search step a search tuple is loaded into the same address of the dictionary.

3. A system according to claim 2 in which the run length encoder register means is arranged to count the number of times the same search tuple is loaded into the same address of the dictionary.

4. A system according to claim 2 in which a further address in the dictionary is reserved to indicate the number of times a search tuple is repeated.

5. A system according to claim 3 in which a further address in the dictionary is reserved to indicate the number of times a search tuple is repeated.

6. A system according to claim 1 in which the dictionary is arranged to hold data elements which are all of precisely equal length and each dictionary entry holds multiple data elements.

7. The system according to claim 6 in which each dictionary entry holds up to 4 data elements.

8. A system according to claim 1 in which consecutive matches are indicated by transmission of a dictionary address which is not yet utilised for storage of dictionary data.

9. A lossless data decompression system for decompressing a compressed data signal, the decompression system comprising a dictionary and a decoder, and a run length decoder register connected to receive the output of decoder.

10. A lossless data decompression system as claimed in claim 9, the system further comprising repetition means responsive to a component in a compressed data signal to cause data to be repeated at an output of the system.

11. A lossless data decompression system as claimed in claim 10, the repetition means being adapted to cause a plurality of repetitions of decompressed data.

12. A lossless method of compressing data comprising the steps of:

comparing a search tuple of variable length with a plurality of tuples of the same length stored in a dictionary;

indicating the location in the dictionary of a full or partial match or matches;

selecting a best match of any plurality of matches;

encoding the match location and the match type;

loading each search tuple in turn into the same address in the dictionary; and counting the number of times identical tuples are matched consecutively into said address.

* * * * *